United States Patent
Rowe, Jr. et al.

(10) Patent No.: US 7,063,987 B2
(45) Date of Patent: Jun. 20, 2006

(54) BACKSIDE FAILURE ANALYSIS OF INTEGRATED CIRCUITS

(75) Inventors: Walter J. Rowe, Jr., Palm Bay, FL (US); Isaiah McDonald, Palm Bay, FL (US); Malcolm P. Cambra, Jr., Palm Bay, FL (US)

(73) Assignee: Intersil Americas Inc., Milpitas, CA (US)

( * ) Notice: Subject to any disclaimer, the term of this patent is extended or adjusted under 35 U.S.C. 154(b) by 117 days.

(21) Appl. No.: 10/738,144

(22) Filed: Dec. 17, 2003

(65) Prior Publication Data
US 2005/0136563 A1  Jun. 23, 2005

(51) Int. Cl.
*H01L 21/00* (2006.01)
*H01L 21/44* (2006.01)
*H01L 21/48* (2006.01)
*H01L 21/50* (2006.01)
*G01R 31/26* (2006.01)

(52) U.S. Cl. .............................. 438/4; 438/14; 438/15; 438/124; 438/690

(58) Field of Classification Search .................... 438/4, 438/14, 15, 124, 690
See application file for complete search history.

(56) References Cited

U.S. PATENT DOCUMENTS
6,159,838 A * 12/2000 Tsai et al. .................... 438/616

* cited by examiner

*Primary Examiner*—William M. Brewster
(74) *Attorney, Agent, or Firm*—Fogg and Associates, LLC; Scott V. Lundberg

(57) ABSTRACT

Backside failure analysis of integrated circuits. In one embodiment, a method of preparing a device under test (DUT) for an image based diagnostic testing is disclosed. The method comprises removing a portion of the backside package of the DUT to allow for the implementation of an image based diagnostic test through the backside of the DUT. The functionality of DUT is destroyed by the removal of the portion of the backside package of the DUT. Further, restoring the functionality of the DUT with an interface carrier before an image based diagnostic test is conducted.

18 Claims, 6 Drawing Sheets

BACKSIDE FAILURE ANALYSIS OF INTEGRATED CIRCUITS

TECHNICAL FIELD

The present invention relates generally to the testing of electronic devices and in particular backside failure analysis of integrated circuits.

BACKGROUND

Failure analysis of integrated circuits is required to identify the root causes of product failures that occur during manufacture, technology evaluations and in end user systems in the field. The results of this analysis are used to drive technology, product design, and test enhancements which in turn lead to improved product quality and reliability. A typical failure analysis is done through the topside of a package (i.e. a package that contains the integrated circuit) (topside analysis). However, as integrated circuits become more complex (i.e. as the minimum process features translation below 0.35 um and interconnect layers move beyond three layers) typical topside failure analysis become ineffective. One possible method of performing failure analysis on complex integrated circuits is with image based diagnostic tools designed to allow inspection through the backside of the silicon substrate of the integrated circuit. This backside analysis, however, is limited because the silicon, on the backside, has to be thinned (removed) to less than 100 microns while maintaining the circuit's functionality for the image based diagnostic tool to effectively evaluate the circuit. Moreover, in some advanced packages, used in the semiconductor industry, signal layers are used that pass beneath the silicon substrate. In order to gain access to the backside of the circuit, the aforementioned package signal layers must be removed. However, the removal of these signal layers would stop the circuit's functionality and thereby make the image based diagnostic tools ineffective.

For the reasons stated above and for other reasons stated below which will become apparent to those skilled in the art upon reading and understanding the present specification, there is a need in the art for a method and apparatus to conduct image based diagnostic analysis on the backside of relatively complex integrated circuit packages.

SUMMARY

The above-mentioned problems and other problems are resolved by the present invention and will be understood by reading and studying the following specification.

In one embodiment, a method of preparing a device under test (DUT) for an image based diagnostic test is disclosed. The method comprises removing a portion of the backside package of the DUT to allow for the implementation of a image based diagnostic test through the backside of the DUT. The functionality of DUT is destroyed by the removal of the portion of the backside package of the DUT. Further, restoring the functionality of the DUT with an interface carrier before the image based diagnostic test is conducted.

In another embodiment, a method of testing a device under test (DUT) is disclosed. The method comprises removing a portion of a backside of the DUT to expose a select signal layer. Coupling the DUT to an interface carrier. Electrically coupling select device contacts of the exposed select signal layer of the DUT to select interface contacts of the interface carrier to restore functionality of the DUT and testing the DUT after the functionality of the DUT has been restored.

In yet another embodiment, an interface carrier is disclosed. The interface carrier includes interface routing paths with interface contacts. The interface routing paths are adapted to provide signal connections for a device under test (DUT) that has had a portion of its backside removed. The interface contacts are adapted to be electrically coupled to select device contacts of the DUT.

In further another embodiment a testing system is disclosed. The testing system includes an image based diagnostic tool and an interface carrier. The interface carrier has interface contacts that are adapted to be electrically coupled to select device contacts in a device under test (DUT), wherein the select device contacts are contacts that have been exposed by removing a portion of a backside of a package containing the DUT. Moreover, the image based diagnostic tool is adapted to be applied through the backside of the package of the DUT after the portion of the backside package has been removed.

BRIEF DESCRIPTION OF THE DRAWINGS

The present invention can be more easily understood and further advantages and uses thereof more readily apparent, when considered in view of the description of the preferred embodiments and the following figures in which.

In accordance with common practice, the various described features are not drawn to scale but are drawn to emphasize specific features relevant to the present invention. Reference characters denote like elements throughout Figures and text.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

In the following description, the term "topside" is used to refer generally to the side of an integrated circuit, or other packaged device, that is formed over a wafer or substrate. The topside is further defined as being located such that a device region is generally formed between the topside and the substrate no matter the orientation of the integrate circuit package. The term "backside" is used to refer generally to the side of the integrated circuit that is opposite the topside. Embodiments of the present invention provide a method and interface carrier apparatus to allow an image based diagnostic analysis through the backside of an integrated circuit package or similar semiconductor packaged device (or more generally a device under test (DUT)).

Figure 1:
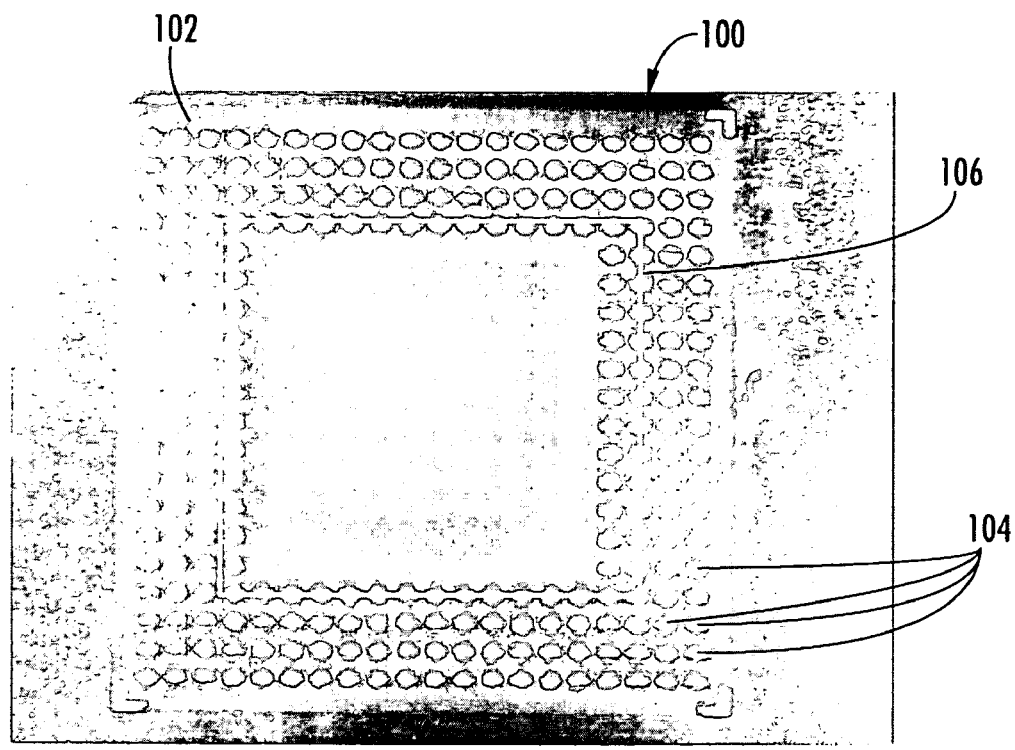
FIG. 1 is a backside image of a CABGA package of the prior art.
Figure 2:
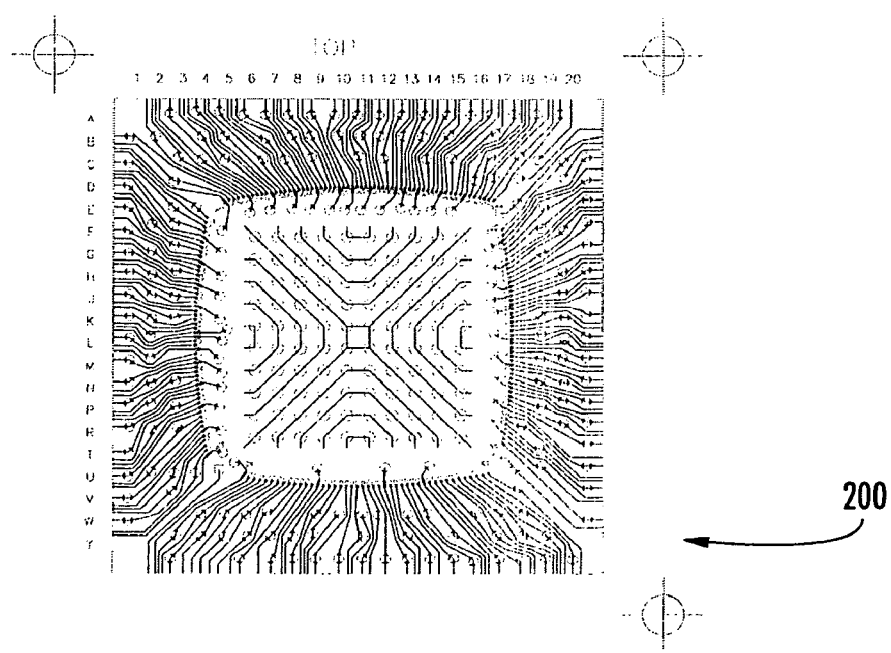
FIG. 2 of example of a footprint layout of a signal layer of the prior art.

Referring to FIG. 1, an image of a backside 102 of a chip array ball grid array (CABGA) 100 of the prior art is illustrated. The backside 102 of the CABGA 100 includes a plurality of solder balls 104. Also illustrated in this image is an area of interest 106 contained in the highlighted square. The area of interest 106 is an area in which a desired image based diagnostic analysis is to be applied. FIG. 2 is a foot print layout illustrating the signal layer 200 of the CABGA 100 being tested. Although, a CABGA 100 is used as an example of a DUT it will be understood in the art that the present invention is applicable to any integrated package type circuit or device and that the present invention is not limited to CABGA devices.

Figure 3:
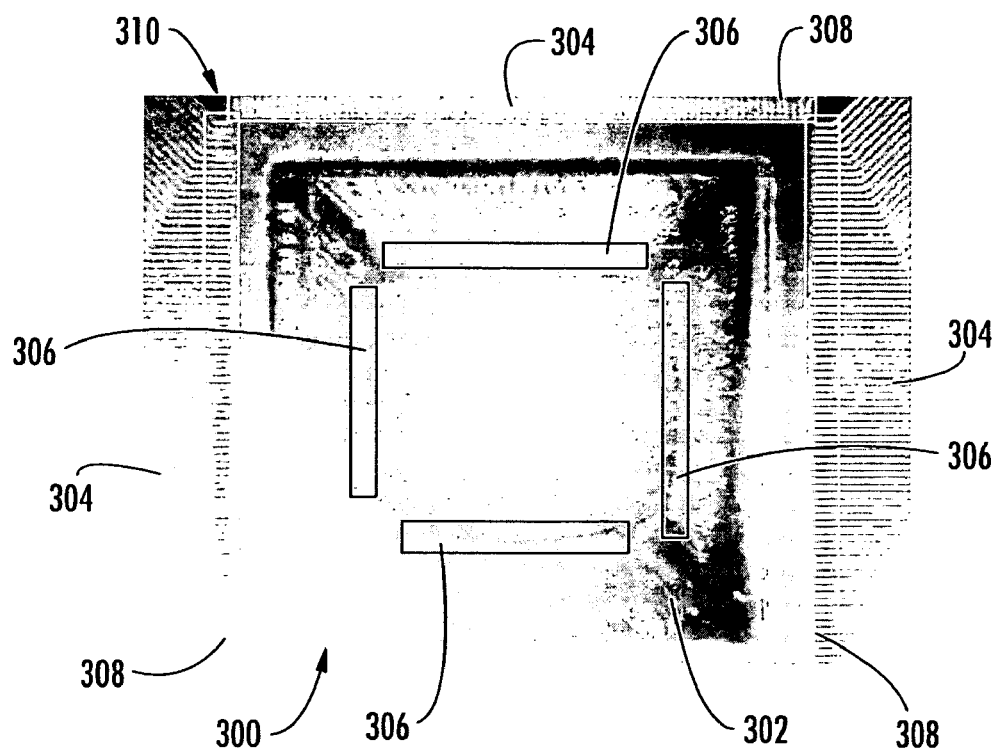
FIG. 3 is an image of a CABGA package with a portion of its backside removed of one embodiment of the present invention.
Figure 4:
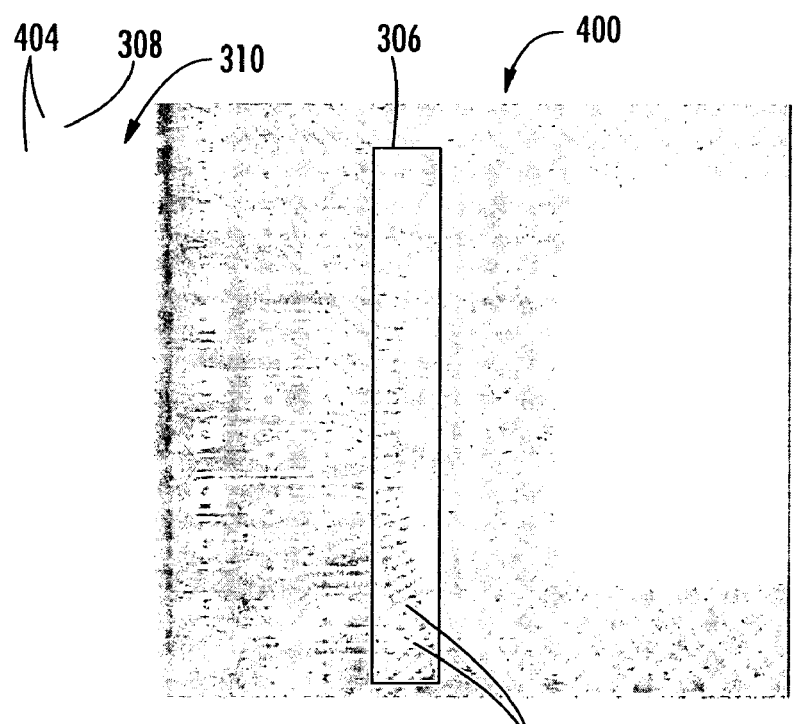
FIG. 4 is an image illustrating exposed device contacts of the CABGA package and interface contacts of the interface carrier of one embodiment of the present invention.

In embodiments of the present invention, the backside of a DUT is first mechanically polished to remove the package resin to expose the signal layer. In other embodiments, other methods are used to remove the package resin from the backside such as laser decapsulation or other etch techniques. FIG. 3 is an image a backside 302 of a CABGA 300 (the DUT in this example) that has some of its package plastic resin removed so that a signal layer has been exposed. Device contact areas 306 of the signal layers are generally indicated within associated rectangles. FIG. 3, also illustrated an interface carrier 310 of the present invention. The interface carrier 310 includes a plurality of interface routing paths 304. The plurality of interface routing paths allow for the interface carriers 310 use with different types of DUT's as well as DUT's with varying numbers of pins. For example, in one embodiment a DUT with 320 pins can be accommodated. The interface carrier 310 is adapted to enable the mounting of the DUT thereon. Also illustrated in FIG. 3 are interface contact areas 308 generally indicated within the associated rectangles. FIG. 4, illustrates a close up view 400 of an interface contact area 308 of the interface carrier 310 and an device contact area 306 of the DUT (which in this example is CABGA 300) with some of the package resin removed. In particular, FIG. 4 illustrates the interface contacts 404 of the interface carrier 301 and the device contacts 402 of the DUT 300.

Figure 5:
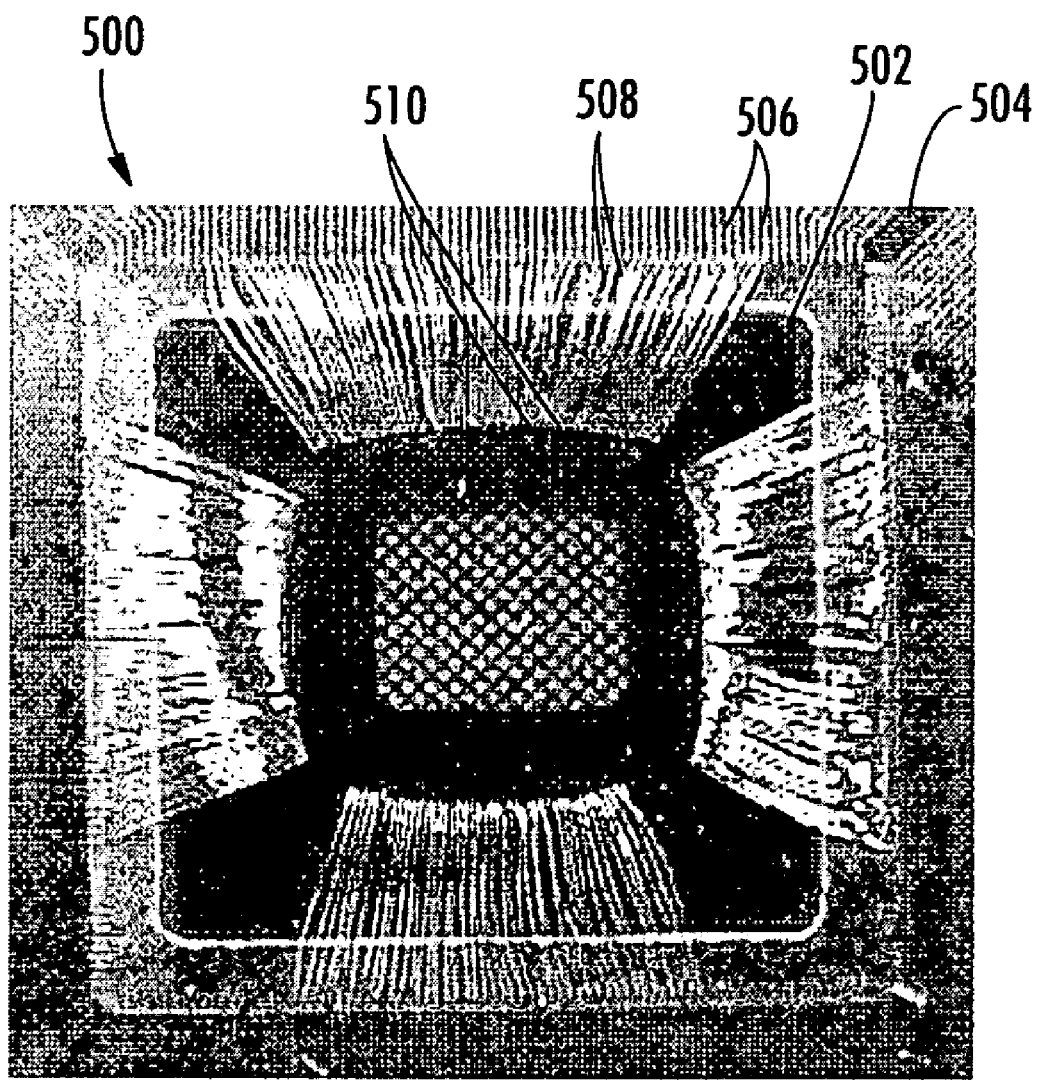
FIG. 5 is an image illustrating bond wire electrical connections between the device contacts and the interface contacts of one embodiment of the present invention.

Referring to FIG. 5, a connected image 500 of a DUT 502 electrically coupled to an interface carrier 504 of one embodiment of the present invention is illustrated. In particular, electrical connections 508 are coupled between select interface contacts 506 of the interface carrier 504 and device contacts 510 of the DUT to restore functionality of the DUT. In one embodiment, the electrical connections are made by bond wire techniques. Once the electrical connections are in place, a tester coupled to the interface carrier 504 applies signals to the DUT while an imaging based diagnostic tool analyzes how the DUT responds to the signal. Accordingly, the present invention allows for the use of an imaging based diagnostic tool on the backside of the DUT package even with solder balls and the like removed. More generally, the present invention allows for the restoration of functionality of a DUT when portions of the backside of the DUT's package are removed.

Figure 6:
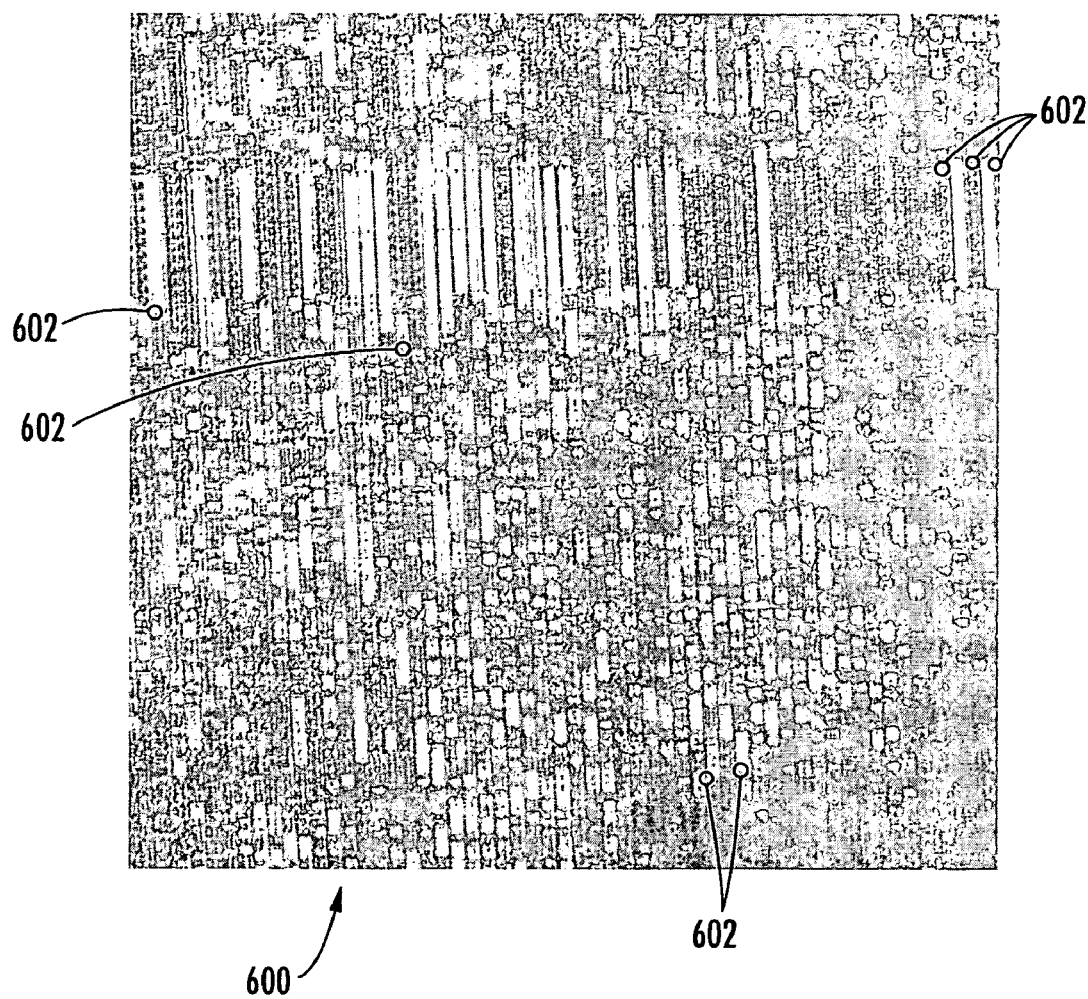
FIG. 6 is an image of a BB/MAC product taken through the backside of the silicon with a 1300 nm laser-scanning microscope of one embodiment of the present invention.

FIG. 6 is an illustration of an image of a baseband and medium access controller (BB/MAC) product 600 taken through the backside of a DUT with a 1300 nm laser-scanning microscope. This example of an imaging based diagnostic tool illustrates potential fault areas 602 in the DUT through the backside of the DUT. In particular, this test image 600 illustrates the change in resistance as a function of the laser simulation. In this particular example, potential fault sites 602 have been located as a result of the imaging based diagnostic tool. Without access through the backside of a DUT as described with the various embodiments of the present invention, use of the imaging based diagnostic tool to find fault sites would not be possible in DUT's that have multiple metal layers.

Figure 7:
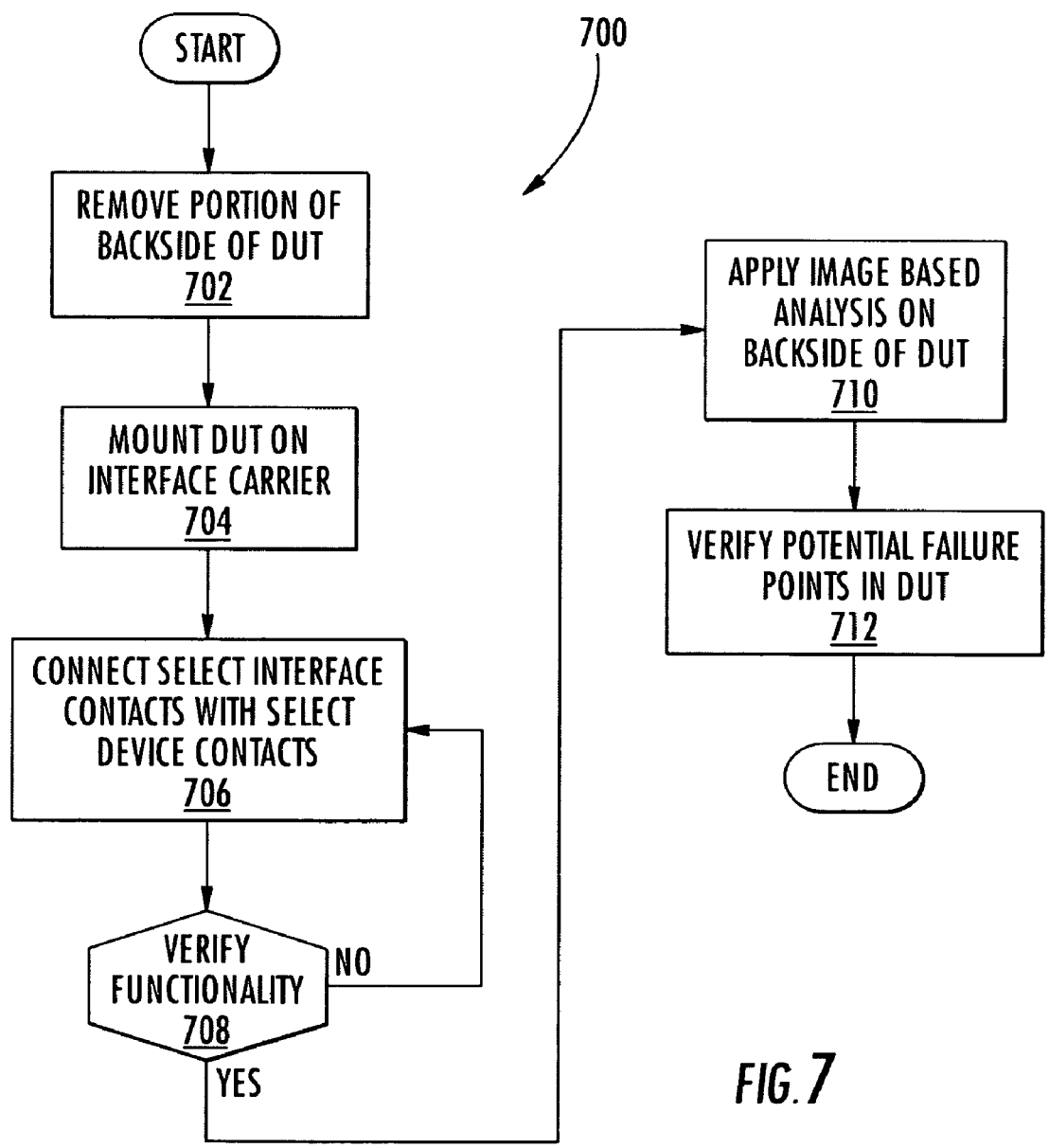
FIG. 7 is a flow chart illustrating a method of one embodiment of the present invention.

Referring to FIG. 7, a flow chart 700 illustrating a method of one embodiment of the present invention is illustrated. In this embodiment, the method starts by removing a portion of the backside of a DUT (702). This is done to expose device contacts of the DUT. The DUT is then mounted on an interface carrier (704). Once the DUT has been mounted to the interface carrier (704), select exposed device contacts of the DUT are electrically coupled to select interface contacts of the interface carrier (706). These electrical couplings are used to reestablish functionality of the DUT that was lost due to the removal of such things as solder balls and portions of signals layers that occurred during the removal of portions of the backside of the DUT in step 702. Next the functionality of the DUT is determined (708). In one embodiment this is done with ATE test equipment. If the functionality of the DUT cannot be established (708), further electrical couplings between device contacts and interface contacts are established (704). Once the functionality of the DUT is established (708), the DUT backside failure analysis is performed on the DUT (710). In one embodiment, the backside failure analysis is a image based diagnostic test. Based on the results of the backside failure analysis (710), potential fault points are identified and displayed (712).

Figure 8:
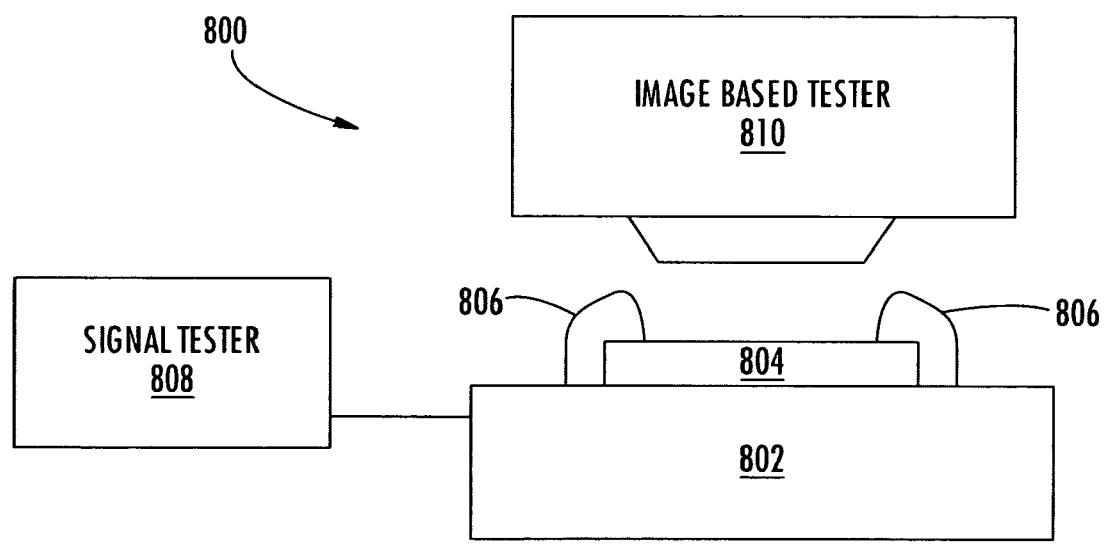
FIG. 8 is a diagram of a testing system of one embodiment of the present invention.

FIG. 8 illustrates a block diagram of a testing system 800 of one embodiment of the present invention. The testing system 800 includes an interface carrier 802 adapted to mount a DUT 804 thereon. Electrical connections 806 are formed to couple device contacts of the DUT to interface contacts of the interface carrier 802. A signal tester 808 is coupled to the interface carrier 802 to provide signals to select device contacts of the DUT to verify the functionality of the DUT. An image based tester 810 then analysis the DUT. Moreover, in one embodiment, the signal tester provides operational signals used during the image based analysis.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of preparing a device under test (DUT) for an image based diagnostic test, the method comprising:

removing a portion of the backside package of the DUT to allow for the implementation of a image based diagnostic test through the backside of the DUT, the electrical functionality of DUT being destroyed by the removal of the portion of the backside package of the DUT; and restoring the electrical functionality of the DUT with an interface carrier before an image based diagnostic test is conducted.

2. The method of claim 1, wherein the removing of the portion of the backside package of the DUT further comprises:

mechanically polishing the backside of the package.

3. The method of claim 1, wherein the removing of the portion of the backside package of the DUT further comprises:

decapsulating the backside package with a laser.

4. The method of claim 1, wherein the removing of the portion of the backside package of the DUT further comprises:

etching the backside of the package.

5. The method of claim 1, wherein removing the portion of the backside of the package of the DUT further comprises:

removing package resin.

6. The method of claim 1, wherein removing the portion of the backside of the package of the DUT further comprises:

removing solder balls.

7. The method of claim 1, wherein removing the portion of the backside of the package of the DUT further comprises:

removing select signal layers.

8. The method of claim 1, further comprising:

verifying the functionality of the DUT.

9. The method of claim 1, wherein removing the portion of the backside of the package exposes device contacts of the DUT.

10. The method of claim 9, wherein restoring functionality of the DUT comprises:

electrically coupling select exposed device contacts with select interface contact of the interface carrier.

11. The method of claim 10, wherein electrically coupling the select exposed device contacts with select interface contact of the interface carrier further comprises:

bonding wires across the select device contacts and select interface contacts.

12. A method of testing a device under test (DUT), the method comprising:

removing a portion of a backside of the DUT to expose a select signal layer the electrical functionality of the DUT being destroyed by the removal of the portion of the backside package of the DUT;

coupling the DUT to an interface carrier;

electrically coupling select device contacts of the exposed select signal layer of the DUT to select interface contacts of the interface carrier to restore electrical functionality of the DUT; and testing the DUT after the functionality of the DUT has been restored.

13. The method of claim 12, wherein removing the portion of the backside of the DUT further comprises:

mechanically polishing the backside of the DUT.

14. The method of claim 12, wherein removing the portion of the backside of the DUT further comprises:

decapsulating the backside of the DUT with a laser.

15. The method of claim 12, wherein removing the portion of the backside of the DUT further comprises:

etching the backside of the DUT.

16. The method of claim 12, wherein electrically coupling select device contacts of the exposed select signal layer of the DUT to select interface contacts of the interface carrier further comprises:

bonding wires to each select device contact and its associated interface contact.

17. The method of claim 12, wherein the testing of the DUT further comprises:

performing an image based diagnostic test through the backside of the DUT.

18. The method of claim 12, further comprising:

verifying the functionality of the DUT after the DUT has been electrically coupled to the interface carrier.

* * * * *